United States Patent
DeCusatis et al.

(10) Patent No.: US 6,751,014 B2
(45) Date of Patent: Jun. 15, 2004

(54) AUTOMATIC GAIN CONTROL AND DYNAMIC EQUALIZATION OF ERBIUM DOPED OPTICAL AMPLIFIERS IN WAVELENGTH MULTIPLEXING NETWORKS

(75) Inventors: Casimer M. DeCusatis, Poughkeepsie, NY (US); Lawrence Jacobowitz, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 09/884,671

(22) Filed: Jun. 19, 2001

(65) Prior Publication Data

US 2002/0191279 A1 Dec. 19, 2002

(51) Int. Cl.[7] .............................................. H04B 10/12
(52) U.S. Cl. ............................. 359/341.41; 359/341.42
(58) Field of Search ....................... 359/341.41, 341.42, 359/334, 333

(56) References Cited

U.S. PATENT DOCUMENTS

| | | | |
|---|---|---|---|
| 3,586,997 A | * 6/1971 | Kinsel | 359/340 |
| 3,713,042 A | * 1/1973 | Kinsel | 372/18 |
| 3,777,154 A | 12/1973 | Lindsey | |
| 3,943,021 A | 3/1976 | Lindsey | |
| 4,725,120 A | 2/1988 | Parzygnat | |
| 4,744,617 A | 5/1988 | Hvezda et al. | |
| 4,863,332 A | 9/1989 | Wiholm et al. | |

(List continued on next page.)

FOREIGN PATENT DOCUMENTS

| | | |
|---|---|---|
| EP | 0 486 208 A2 | 5/1992 |
| EP | 0 571 037 A1 | 11/1993 |
| EP | 0 911 658 A1 | 4/1999 |
| JP | 03250932 A | * 11/1991 ... H04B/10/16 |
| JP | 6-19838 | 1/1994 |
| WO | WO 94/18587 | 8/1994 |
| WO | WO 94/18589 | 8/1994 |
| WO | WO 96/10201 | 4/1996 |

OTHER PUBLICATIONS

Masuda et al. Elec. Letts. Sep. 24, 1992, vol. 28, No. 20.*
Miller et al. Elec. Letts. Jan. 30, 1992 vol. 28, No. 3.*
Roos et al. J of Q Elec. vol. 36, No. 11, Nov. 2000.*
Lai et al. IEEE Trans. on Industrial Elec. vol. 42, No. 3, Jun. 1995.*
Li et al, IEEE Trans. on Indus. Elec. vol. 39, No. 2, Apr. 1992.*
Hsieh. IEEE Trans. on Indus. Elec. vol. 36, No. 3, Aug. 1989.*
Lyu et al. Elec. Letts. Jan. 19, 1995 vol. 31, No. 2.*
Lee et al. IEEE Phot. Tech. Letts, vol. 10, No. 2, Feb. 1998.*
Park et al. Elec. Letts. Jun. 6, 1996, vol. 32, No. 12.*
"Introduction to DWDM Technology Data in a Rainbow", by Stamatios V. Kartalopoulos, Lucent Technologies, IEEE Communications Society, Sponsor, SPIE Optical Engineering Press, pp. 67–68.

(List continued on next page.)

Primary Examiner—Thomas G. Black
Assistant Examiner—Stephen Cunningham
(74) Attorney, Agent, or Firm—Scully, Scott, Murphy & Presser; Tiffany L. Townsend, Esq.

(57) ABSTRACT

A system and method for controlling alignment of laser center wavelengths and filter passband center wavelengths in optical amplifiers for purposes of providing automatic gain control and eliminating unwanted noise. The system and method exploits a wavelength-locked loop servo-control circuit and methodology that enables real time mutual alignment of a laser pump signal having a peaked spectrum function including a center wavelength and a wavelength selective device such as an optical filter implementing a peaked passband function including a center wavelength in an optical amplifier.

21 Claims, 11 Drawing Sheets

U.S. PATENT DOCUMENTS

| | | |
|---|---|---|
| 4,870,637 A | 9/1989 | Follett et al. |
| 4,872,739 A | 10/1989 | Kahn et al. |
| 4,890,894 A | 1/1990 | Kwa |
| 4,892,376 A | 1/1990 | Whitehouse |
| 4,895,424 A | 1/1990 | Hughes |
| 4,943,136 A | 7/1990 | Popoff |
| 4,944,568 A | 7/1990 | Danbach et al. |
| 4,954,786 A * | 9/1990 | Yamakawa et al. .......... 250/205 |
| 4,963,832 A * | 10/1990 | Desurvire et al. ..... 359/341.41 |
| 5,009,477 A | 4/1991 | Alferness et al. |
| 5,071,216 A | 12/1991 | Sullivan |
| 5,101,460 A | 3/1992 | Richard |
| 5,121,405 A * | 6/1992 | Negus .......................... 320/114 |
| 5,134,508 A | 7/1992 | Corda |
| 5,136,600 A * | 8/1992 | Fidric et al. ................... 372/32 |
| 5,144,691 A | 9/1992 | August et al. |
| 5,155,784 A | 10/1992 | Knott |
| 5,155,785 A | 10/1992 | Holland et al. |
| 5,182,780 A | 1/1993 | Robertson |
| 5,204,925 A | 4/1993 | Bonanni et al. |
| 5,218,654 A | 6/1993 | Sauter |
| 5,228,105 A | 7/1993 | Glista |
| 5,240,617 A | 8/1993 | Hopf |
| 5,245,680 A | 9/1993 | Sauter |
| 5,245,690 A * | 9/1993 | Aida et al. ............. 359/337.11 |
| 5,247,593 A | 9/1993 | Lin et al. |
| 5,259,051 A | 11/1993 | Burack et al. |
| 5,268,786 A * | 12/1993 | Matsushita et al. ......... 359/177 |
| 5,268,981 A | 12/1993 | Shahid |
| 5,280,551 A | 1/1994 | Bowen |
| 5,283,851 A | 2/1994 | Vergnolle |
| 5,335,109 A * | 8/1994 | Heidemann ................. 359/177 |
| 5,367,598 A | 11/1994 | Devenish, III et al. |
| 5,371,820 A | 12/1994 | Welbourn et al. |
| 5,388,174 A | 2/1995 | Roll et al. |
| 5,402,515 A | 3/1995 | Vidacovich et al. |
| 5,483,233 A * | 1/1996 | Pettitt et al. ........... 340/870.09 |
| 5,633,750 A * | 5/1997 | Nogiwa et al. ............. 359/177 |
| 5,644,423 A * | 7/1997 | Iwano ........................ 359/133 |
| 5,696,780 A * | 12/1997 | Pieterse et al. ............. 359/328 |
| 5,703,711 A * | 12/1997 | Hamada ..................... 359/177 |
| 5,864,423 A * | 1/1999 | Kosaka ....................... 359/134 |
| 5,883,735 A * | 3/1999 | Sugiyama et al. .......... 359/143 |
| 6,055,092 A * | 4/2000 | Sugaya et al. .............. 359/134 |
| 6,055,094 A * | 4/2000 | Shima et al. ............... 359/124 |
| 6,108,123 A * | 8/2000 | Kinoshita ................... 359/161 |
| 6,108,282 A * | 8/2000 | Jacobowitz et al. ..... 369/44.13 |
| 6,215,584 B1 * | 4/2001 | Yang et al. ................. 359/124 |
| 6,222,813 B1 * | 4/2001 | DeCusatis et al. ..... 369/112.24 |
| 6,282,017 B1 * | 8/2001 | Kinoshita ................... 359/161 |
| 6,295,308 B1 * | 9/2001 | Zah ............................. 372/50 |
| 2001/0003550 A1 * | 6/2001 | Yamaguchi .................. 385/24 |
| 2001/0033413 A1 * | 10/2001 | Lelic et al. ............. 359/341.4 |

OTHER PUBLICATIONS

"Introduction to DWDM Technology Data in a Rainbow", by Stamatios V. Kartalopoulos, Chapter 9, pp. 131–136.

"Distributed feedback semiconductor lasers", by John Carroll, et al., IEE Circuits, Devices and Systems Series 10, SPIE Press Monograph vol. PM52, 1998, pp. 7–15.

IEEE Communications, SPIE Optical Engineering Press, Stamatios V. Kartalopoulos, "Introduction to DWDM Technology: Data in a Rainbow", pp. 67 and 68, 2000.

The Institution of Electrical Engineers, IEE Circuits, Devices and Systems Series 10, John Carroll, James Whiteaway & Dick Plumb, "Distributed Feedback Semiconductor Lasers", pp. 9–15, 1998.

Chapter 9, "Other Optical Components", pp. 131–137, No date.

"An Introduction to Pound–Drever–Hall Laser Frequency Stabilization", Eric D. Black, LIGO Project, California Institute of Technology, LIGO–P990042–00–D, pp. 1–36, No date.

* cited by examiner

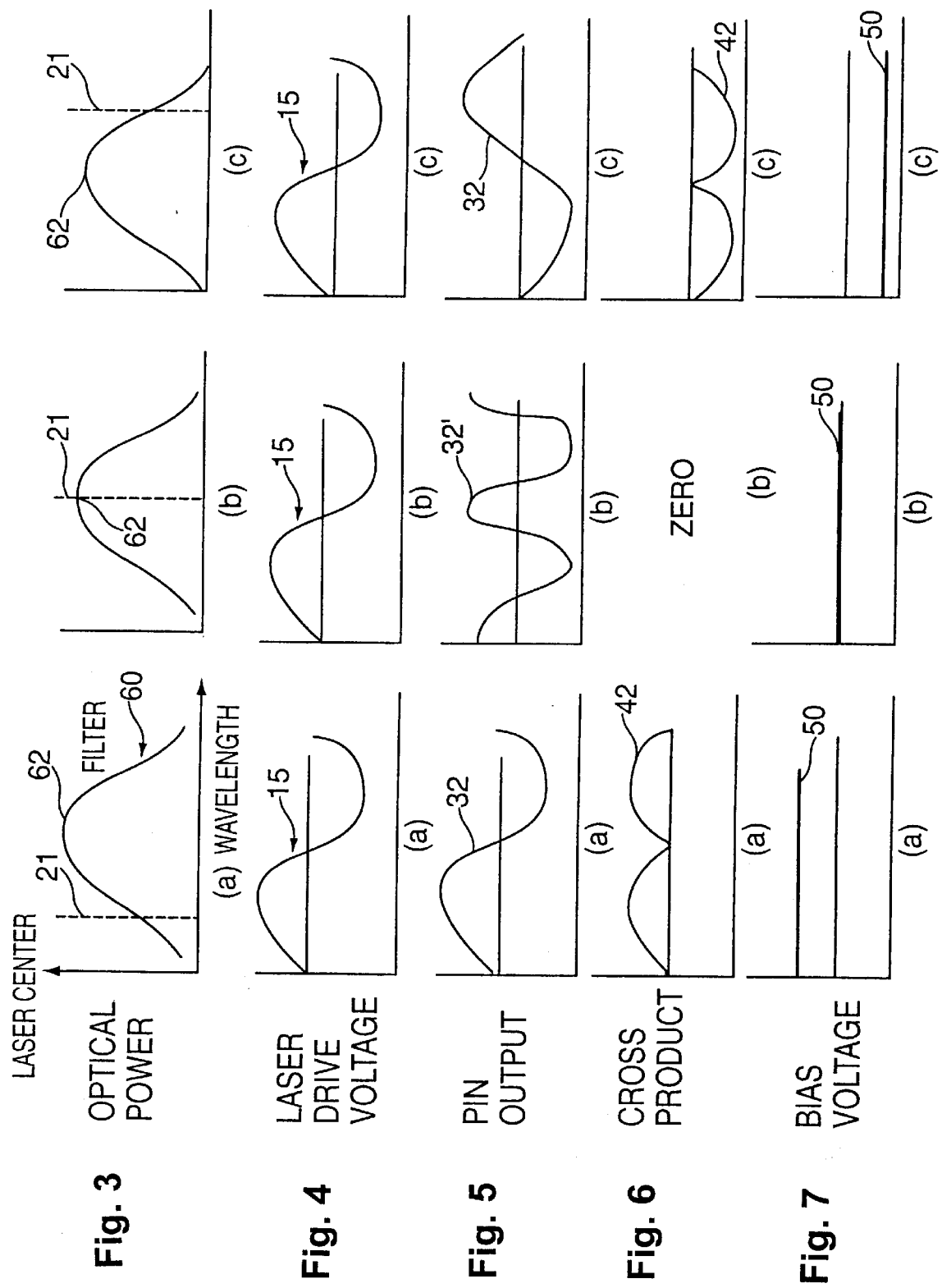

AUTOMATIC GAIN CONTROL AND DYNAMIC EQUALIZATION OF ERBIUM DOPED OPTICAL AMPLIFIERS IN WAVELENGTH MULTIPLEXING NETWORKS

BACKGROUND OF THE INVENTION

1. Field of the Invention

The present invention relates generally to optical devices such as lasers, and fiber optic data transmission systems employing the same, and particularly to a novel wavelength-locked loop servo-control circuit for optimizing performance of optical amplifiers.

2. Description of the Prior Art

Wavelength Division Multiplexing (WDM) and Dense Wavelength Division Multiplexing (DWDM) are light-wave application technologies that enable multiple wavelengths (colors of light) to be paralleled into the same optical fiber with each wavelength potentially assigned its own data diagnostics. Currently, WDM and DWDM products combine many different data links over a single pair of optical fibers by re-modulating the data onto a set of lasers, which are tuned to a very specific wavelength (within 0.8 nm tolerance, following industry standards). On current products, up to 32 wavelengths of light can be combined over a single fiber link with more wavelengths contemplated for future applications. The wavelengths are combined by passing light through a series of thin film interference filters, which consist of multi-layer coatings on a glass substrate, pigtailed with optical fibers. The filters combine multiple wavelengths into a single fiber path, and also separate them again at the far end of the multiplexed link. Filters may also be used at intermediate points to add or drop wavelength channels from the optical network.

Optical amplifiers are used to extend the distance of transmitted signals in fiber optic networks. This enables optical signals to be amplified without incurring the additional latency (and computer performance impact) of an optical-to-optical conversion. Optical amplifiers additionally offer lower timing jitter in some cases, and improved performance on long links.

In Wavelength Division Multiplexing (WDM) applications, optical amplifiers must be implemented to amplify many wavelengths spaced closely together at the same time. The basic function of the optical amplifier is to accept an input optical signal and amplify it without converting the signal to electrical form. An Erbium Doped Fiber Amplifier (hereinafter "EDFA") is one type of optical amplifier that relies on stimulated emission of light at the proper signal wavelength. For example, as shown in FIG. 1, the basic EDFA 99 receives an input optical signal 120, which may consist of multiple wavelengths near the 1550 nm passband. This input signal 120 is passed through a circulator or optical isolator 130 to remove unwanted noise, and then enters via coupler 150, a section of optical fiber 170 several meters in length that is doped with Erbium ions. The principles of operation for the EDFA itself are well known: the Erbium is excited to an elevated energy state by a laser diode pump (LD pump) 110, similar to an optically pumped laser system. The LD pump 110 particularly generates a pump laser signal that is coupled to the erbium doped optical fiber 170 through coupler 150. The 1550 nm signal passing through this fiber produces stimulated emission of light at the same wavelengths as the 1550 nm signals, increasing their amplitude by up to 20 dB or more before the signals 190 exit the optical amplifier. By altering the doping of the erbium fiber 170, amplification can be obtained for industry standard C-band and L-band wavelengths. The amplifier gain is proportional to the intensity of the pump laser diode.

It is the case however, that EDFAs also produce background noise in the form of light which is not at the desired wavelength; this results from amplification of random photons outside the signal bandwidth, or spontaneous emission of photons within the EDFA which are subsequently amplified. This phenomena is known as Amplified Spontaneous Emission (ASE) noise. Most optical amplifiers have a strong ASE peak around a wavelength of 1533 nm, with weaker effects at other wavelengths. For this reason, commercial EDFAs are designed with a filter to remove ASE at this wavelength. However, as it is not possible to make an ideal bandpass filter at a specific wavelength, this approach does not remove all the ASE from an amplifier. Consequently, ASE builds up in a network with many stages of amplification, and is a limiting factor in the design of long links. As ASE is proportional to the amplifier gain, it would be highly desirable to provide a system and method for controlling and limiting ASE so that the gain of optical amplifiers may be increased resulting in increased link distances in optical networks.

As noted above, an EDFA operates on the same principle as an optically pumped laser; it consists of a relatively short (about 10 meters) section of fiber doped with a controlled amount of erbium ions. When this fiber is pumped at high power (10 to 300 mW) with light at the proper wavelength (e.g., 980 nm or 1480 nm wavelengths) the erbium ions absorb the light and are excited to a higher energy state. Another incident photon around 1550 nm wavelength will cause stimulated emission of light at the same wavelength, phase, and direction of travel as the incident signal. EDFAs are often characterized by their gain coefficient, defined as the small signal gain divided by the pump power. As the input power is increased, the total gain of the EDFA will slowly decrease; at some point, the EDFA enters gain saturation, and further increases to the input power cease to result in any increase in output power. Since the EDFA does not distort the signal, unlike electronic amplifiers, they are often used in gain saturation. The gain curve of a typical EDFA is not uniform over different wavelengths; for example, the gain at 1560 nm is about twice as large as the gain at 1540 nm. This can be a problem when operating wavelength division multiplexing (WDM) systems; some channels will be strongly amplified and dominate over other channels that are lost in the noise. Furthermore, a significant complication with EDFAs is that their gain profile changes with input signal power levels. Thus, for example, in a WDM system the amplifier response may become nonuniform (different channels have different effective gain) when channels are added or dropped from the fiber. As optical amplifiers do not amplify all wavelengths equally, some form of equalization is required in order to achieve a flat gain across all channels.

Current methods for providing gain equalization include adding an extra WDM channel locally at the EDFA to absorb excess power (gain clamping), and manipulating either the fiber doping or core structure. The most commonly used method today in commercial EDFAs is to manually adjust the gain whenever channels are added or dropped from the network, using variable optical attenuators. However, this type of manual intervention is not desirable in large, complicated networks.

It would thus be highly desirable to provide a system and method of automatic gain control (AGC) for optical amplifiers which automatically provides for the adjustment of the optical gain when there is a change in the power of the input signal.

Furthermore, it would be highly desirable to provide a system and method of automatic gain control (AGC) for optical amplifiers that enables dynamic adjustment of the optical output power of the pump laser diode in response to changing conditions on the input fiber link.

Moreover, it would be desirable to provide the capability of manually adjusting EDFA optical amplifier gain from a remote location.

SUMMARY OF THE INVENTION

It is therefore an object of the present invention to provide a system and method for automatically varying the pump laser power to the optical amplifier, and perform gain equalization for an optical amplifier using a feedback control loop.

It is another object of the present invention to provide a servo/feedback loop for an EDFA optical amplifier implemented in a WDM system, that enables dynamic adjustment of the pump laser power for performing gain equalization across one or more wavelengths in response to changing conditions on the input fiber link.

It is a further object of the present invention to provide a servo/feedback loop for an optical amplifier that enables locking of the pump laser center wavelength to the peak of the passband of an optical filter to reduce generation of unwanted ASE noise in optical amplifier systems.

It is yet another object of the present invention to provide a control mechanism for controlling gain of an EFDA optical amplifier from a remote location without having to make adjustments on the front panel of the optical amplifier product.

It is still another object of the present invention to provide a servo/feedback loop, referred to as a "wavelength-locked loop," that enables dynamic gain control adjustment of an optical amplifier implemented in multi-gigabit laser/optical systems, thereby enabling significantly larger link power budgets and longer supported distances.

It is yet still another object of the present invention to provide a servo/feedback loop, referred to as a "wavelength-locked loop," that enables dynamic gain control adjustment of an optical amplifier implemented in multi-gigabit laser/optical systems such that lower cost lasers and filters may be used providing a significant cost reduction in the equipment utilized.

Thus, according to one aspect of the invention, there is provided an optically pumped amplifier for amplifying optical signals comprising: an optical isolator device for receiving an input optical signal; a laser pump device for generating a laser pump signal having a peaked spectrum function including a center wavelength; an optical filter having a peaked passband function including a center wavelength implemented for receiving the laser pump signal and passing the laser pump signal at a pre-determined wavelength advantageous for amplifying the input signal; a doped fiber element for receiving the input signal and the laser pump signal and amplifying the input light signal in response to receipt of a laser pump signal at the pre-determined wavelength; and, a wavelength-locked loop servo-control circuit that enables real time mutual alignment of the laser pump signal center wavelength with the optical filter having the peaked passband function at the pre-determined wavelength, wherein the laser pump signal is maximally transferred to the erbium doped fiber thereby resulting in reduced noise characteristics of said amplifier.

According to another aspect of the invention, in an optically pumped amplifier including: an optical isolator device for receiving an input optical signal, a laser pump device for generating a laser pump signal having a peaked spectrum function including a center wavelength, an optical filter having a peaked passband function including a center wavelength implemented for receiving the laser pump signal and passing the laser pump signal at a pre-determined wavelength for amplifying the input optical signal; and, a doped fiber element for receiving the input signal and the laser pump signal and amplifying the input light signal in response to receipt of a laser pump signal at the pre-determined wavelength, there is provided an automatic gain control circuit comprising: a bias voltage device for generating a bias signal for input to the laser pump diode, a center frequency of the laser pump signal being determined by a magnitude of the bias signal; a device for tapping off a portion of the input signal to the optically pumped amplifier; a control circuit for receiving the tapped off input signal portion and generating a control signal for regulating an amount of bias signal applied to the pump laser diode; and, wavelength-locked loop circuit for regulating the amount of optical power delivered to the doped fiber element by enabling real time adjustment of the laser pump signal center wavelength with respect to the optical filter peaked passband center wavelength in accordance with the control signal, wherein automatic gain control is provided according to changing conditions of the input signal.

When implemented to provide automatic gain control or, reduce ASE noise, the wavelength-locked loop servo-control circuit comprises: a mechanism for applying a dither modulation signal at a dither modulation frequency to the laser pump signal, and inputting the dither modulated laser pump signal to the optical filter; a mechanism for converting a portion of the dither modulated laser pump signal to an electric feedback signal; a mechanism for continuously comparing the feedback signal with the dither modulation signal and generating an error signal representing a difference between a frequency characteristic of the feedback signal and a dither modulation frequency; and a mechanism for automatically adjusting the center wavelength of the peaked spectrum function of the laser pump signal according to the error signal, wherein the center wavelength of the laser pump signal and the peaked passband function of the optical filter become aligned when the frequency characteristic of the feedback signal is two times the dither modulation frequency. At this point, maximum amplifier gain level is achieved when providing automatic gain control.

Advantageously, the system and method of the present invention may be employed in optical networks such as WDM and DWDM systems.

BRIEF DESCRIPTION OF THE DRAWINGS

Further features, aspects and advantages of the apparatus and methods of the present invention will become better understood with regard to the following description, appended claims, and the accompanying drawings where:

FIGS. 3(a)–3(c) are signal waveform diagrams depicting the relationship between laser optical power as a function of wavelength for three instances of optic laser signals;

FIGS. 4(a)–4(c) are signal waveform diagrams depicting the laser diode drive voltage dither modulation (a sinusoid) for each of the three waveform diagrams of FIGS. 3(a)–3(c);

FIGS. 5(a)–5(c) are signal waveform diagrams depicting the resulting feedback error signal output of the PIN diode for each of the three waveform diagrams of FIGS. 3(a)–3(c);

FIGS. 6(a)–6(c) are signal waveform diagrams depicting the cross product signal resulting from the mixing of the amplified feedback error with the original dither sinusoid;

FIGS. 7(a)–7(c) are signal waveform diagrams depicting the rectified output laser bias voltage signals which are fed back to adjust the laser current and center frequency;

DETAILED DESCRIPTION OF PREFERRED EMBODIMENTS

The present invention is directed to an EDFA optical amplifier implementing a novel servo-control loop for providing a stable, optical pump laser signal at a desired wavelength which can be used to optimize the gain response of an EDFA optical amplifier. When integrated in an EDFA employed in WDM systems, as will be particularly described with respect to FIGS. 8(a)–8(c), the novel servo-control loop may be used to dynamically adjust the amplifier gain response across the broad spectrum of frequencies represented in the input signal, or, the gain response of an individual selected channel, and, alternatively or in addition, and as will be particularly described with respect to FIGS. 9(a)–9(b), may used to remove unwanted ASE noise present in the EDFAs.

Figure 1:
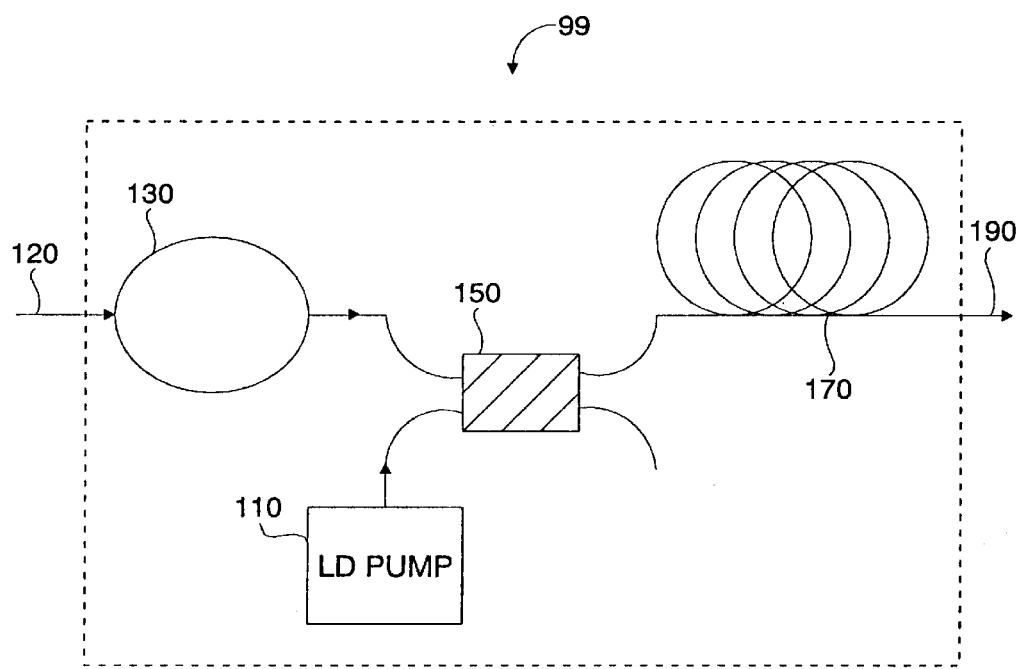
FIG. 1 is a block diagram illustrating the primary components of an erbium doped fiber optical amplifier (EDFA) according to the prior art.
Figure 2A:
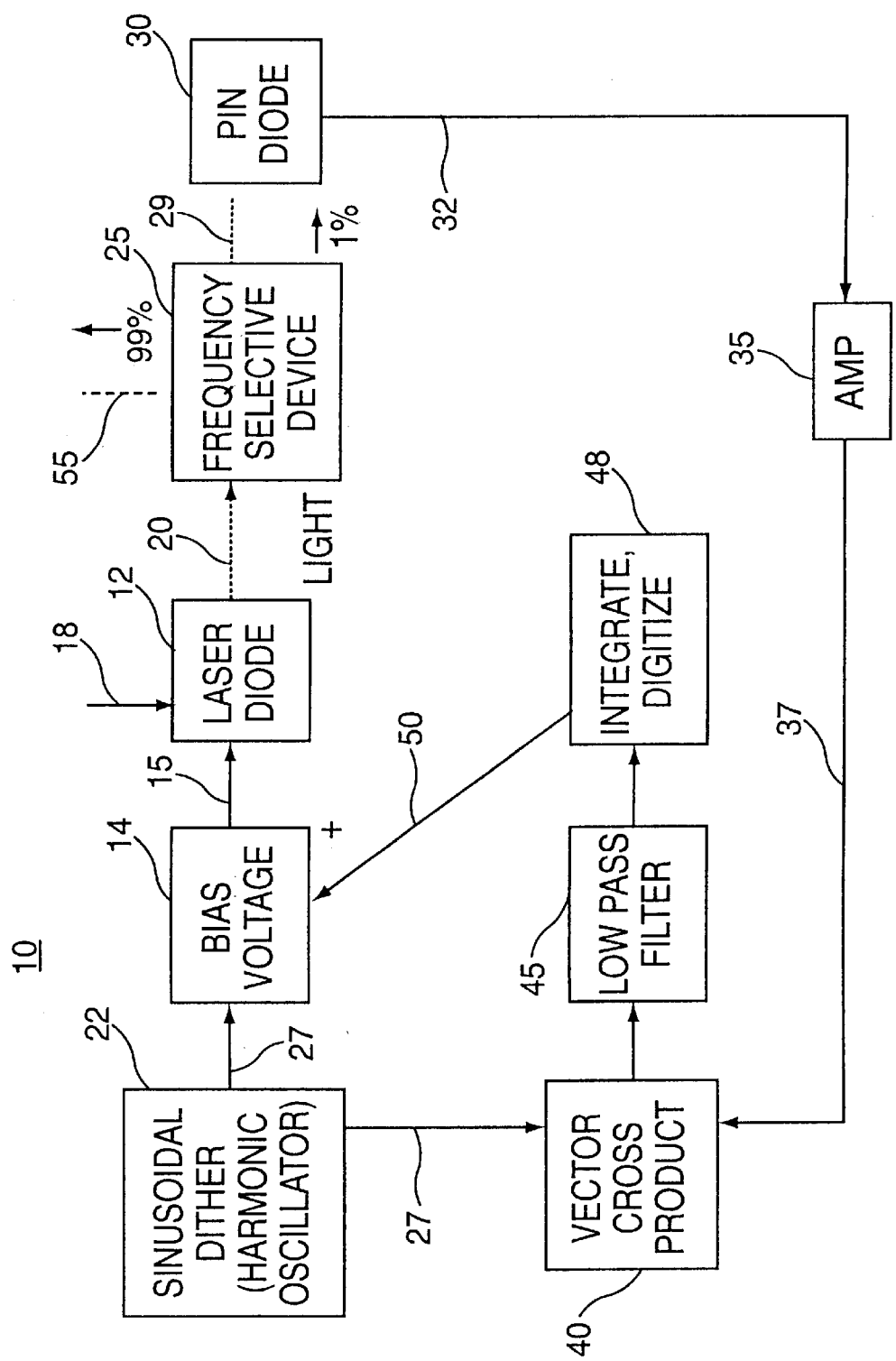
FIGS. 2(a) and 2(b) depict examples of underlying wavelength-locked loop system architectures.

As shown in FIG. 2(a), the novel servo-control system implements a principle referred to herein as the "wavelength-locked loop" or "lambda-locked loop" (since the symbol lambda is commonly used to denote wavelength). The basic operating principle of the wavelength-locked loop (WLL) is described in greater detail in commonly-owned, co-pending U.S. patent application Ser. No. 09/865,256 entitled APPARATUS AND METHOD FOR WAVELENGTH-LOCKED LOOPS FOR SYSTEMS AND APPLICATIONS EMPLOYING ELECTROMAGNETIC SIGNALS, the whole contents and disclosure of which is incorporated by reference as if fully set forth herein.

Particularly, as described in commonly-owned, co-pending U.S. patent application Ser. No. 09/865,256, and with reference to FIG. 2(a), the wavelength-locked loop principle implements a dither modulation to continuously adjust an electromagnetic signal source characterized as having a peaked frequency spectrum or peaked center wavelength, e.g., a laser light source, so as to track the center of a frequency selective device, e.g. a filter passband. In this manner, optimal power of the signal is transmitted and optimal use is made of the system transmission bandwidth.

The principle may be exploited for tuning any light source having a peaked frequency spectrum, and additionally, may be used to tune or adjust transmission properties of frequency selective devices such as tunable filters.

For purposes of description, the basic operating principle of the WLL is shown in FIG. 2(a) which depicts an example optic system 10 including a light source such as laser diode 12 driven with both a bias voltage 15 from a voltage bias circuit 14, and modulated data 18 from a data source (not shown). The laser diode generates an optical (laser light) signal 20 that is received by a bandpass filter 25 or, any frequency selective device including but not limited to: thin film optical interference filters, acousto-optic filters, electro-optic filters, diffraction gratings, prisms, fiber Bragg gratings, integrated optics interferometers, electroabsorption filters, and liquid crystals. The laser diode itself may comprise a standard Fabry Perot or any other type (e.g., Vertical Cavity Surface Emitting (VCSEL)), light emitting diodes, or, may comprise a Distributed Feedback semiconductor laser diode (DFB) such as commonly used for wavelength multiplexing. Preferably, the laser diode emits light in the range of 850 nm to 1550 nm wavelength range. As mentioned, the bandpass filter may comprise a thin film interference filter comprising multiple layers of alternating refractive indices on a transparent substrate, e.g., glass. As further shown in FIG. 2(a), according to the invention, there is an added sinusoidal dither modulation circuit or oscillator 22 for generating a sinusoidal dither modulation signal 27 that modulates the laser bias voltage. The sinusoidal dither signal may be electronically produced, e.g., by varying the current for a laser, or mechanically, by varying the micro-electromechanical system's (MEMS) mirror to vary the wavelength. The dither modulation frequency is on the order of a few kilohertz (kHz) but may range to the Megahertz range. Preferably, the dither modulation frequency is much less than the data rate which is typically on the order of 1–10 GHz. Modulation of the laser diode bias current 15 in this manner causes a corresponding dither in the laser center wavelength. Modulated data is then imposed on the laser, and the optical output passes through the bandpass filter 25. Preferably, the filter 25 is designed to tap off a small amount of light 29, for example, which is incident upon a photo detector receiver device, e.g., P-I-N diode 30, and converted into an electrical feedback signal 32. The amount of light that may be tapped off may range anywhere between one percent (1%) to five percent (5%) of the optical output signal, for example, however, skilled artisans will appreciate any amount of laser light above the noise level that retains the integrity of the output signal including the dither modulation characteristic, may be tapped off. The remaining laser light passes on through the filter 25 to the optical network (not shown). As the PIN diode output 32 is a relatively weak electric signal, the resultant feedback signal is amplified by amplifier device 35 to boost the signal strength. The amplified electric feedback signal 37 is input to a multiplier device 40 where it is combined with the original dither modulation signal 35. The cross product signal 42 that results from the multiplication of the amplified PIN diode output (feedback signal) 37 and the dither signal 35 includes terms at the sum and difference of the dither frequencies. The result is thus input to a low pass filter device 45 where it is low pass filtered and then averaged by integrator circuit 48 to produce an error signal 50 which is positive or negative depending on whether the laser center wavelength is respectively less than or greater than the center point of the bandpass filter. The error signal 50 is input to the laser bias voltage device 15 where it may be added (e.g., by an adder device, not shown)

in order to correct the laser bias current 15 in the appropriate direction. In this manner, the bias current (and laser wavelength) will increase or decrease until it exactly matches the center of the filter passband. Alternately, the error signal 50 may be first converted to a digital form, prior to input to the bias voltage device.

Figure 2B:
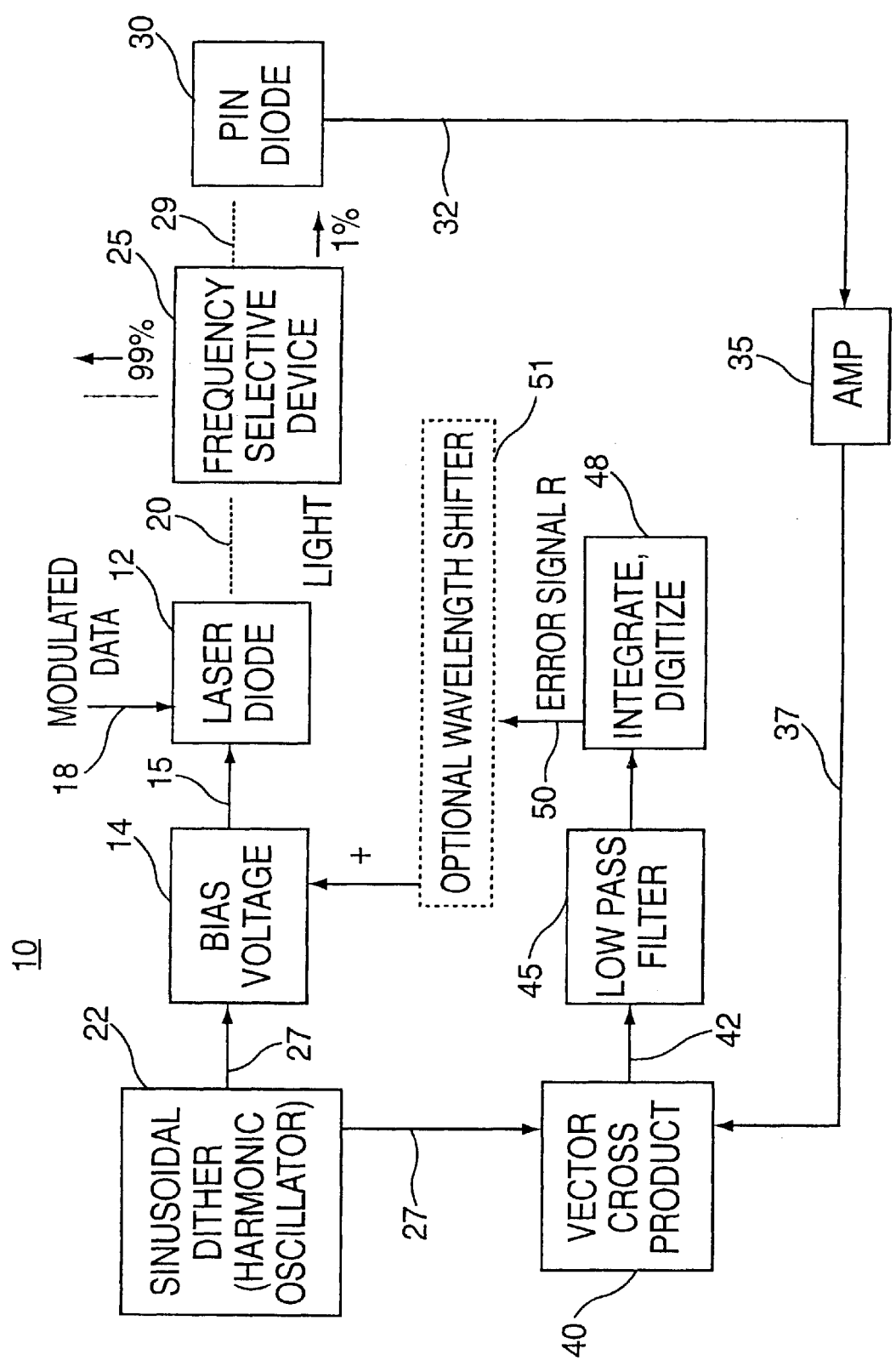

According to one aspect of the invention, the WLL will automatically maintain tracking of the laser center wavelength to the peak of the optical filter. However, in some cases, it may not be desirable to enable laser alignment to the filter peak, e.g., in an optical attenuator. Thus, as shown in FIG. 2(b) which is a system 10' corresponding to the system 10 of FIG. 2(a), there is provided an optional external tuning circuit, herein referred to as a wavelength shifter device 51, that receives the error signal and varies or offsets it so that the laser center wavelength may be shifted or offset in a predetermined manner according to a particular network application. That is, the wavelength shifter 51 allows some external input, e.g., a manual control element such as a knob, to introduce an arbitrary, fixed offset between the laser center wavelength and the filter peak.

Figure 2C:
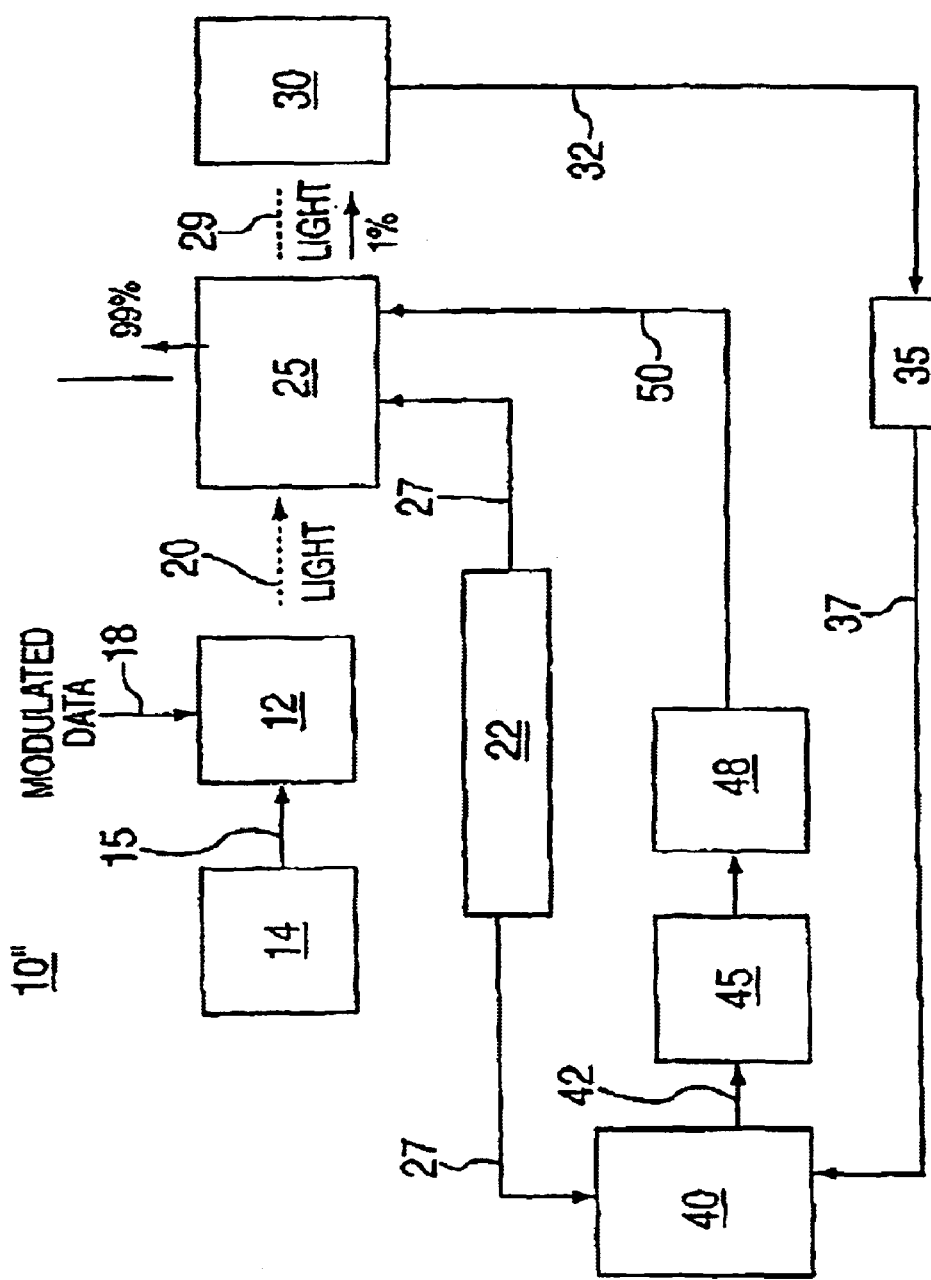
FIG. 2(c) is a general block diagram depicting the underlying system architecture for tuning tunable frequency selective devices such as a bandpass filter according to the principles of the present invention.

It should be understood that, as described in commonly-owned, co-pending U.S. patent application Ser. No. 09/865,246, the WLL servo-control system may be implemented for tuning tunable frequency selective devices such as a bandpass filter for a variety of optical network applications, including optical gain control circuits, such as provided in the present invention. Thus, in the embodiment depicted in FIG. 2(c), the system 10" comprises similar elements as system 10 (of FIG. 2(a)) including a bias voltage generator device 14 for applying a bias signal 15 to the laser diode 12 for generating an optical signal 20 having a peaked spectrum function. This signal 20 is input to a tunable frequency selective device 25, e.g., a tunable bandpass filter. As shown in FIG. 2(c), however, the sinusoidal dither/driver device 22 is implemented for modulating the peak center frequency of filter pass band with a small dither signal 27. A small amount of light 29 is tapped off the output of the filter 25 for input to the photodetector device, e.g., PIN diode 30, where the optical signal is converted to electrical signal 32, amplified by amplifier device 35, and input to the mixer device 40 which additionally receives the dither signal 27. The mixer device generates the vector cross product 42 of the amplified feedback signal 37 with the dither signal 27 and that result is low-pass filtered, and smoothed (e.g., integrated) by integrator device 48 to provide error signal 50, in the manner as will be discussed herein with reference to FIGS. 3–7. This error signal 50 may be a bi-polar signal and may be used to dynamically adjust the peak center frequency of the filter passband until it matches the center frequency of the laser signal input 20.

The operating principle of the WLL is further illustrated in the timing and signal diagrams of FIGS. 3–7. FIGS. 3(a)–3(c) particularly depicts the relationship between laser optical power as a function of wavelength for three instances of optic laser signals: a first instance (FIG. 3(a)) where the laser signal frequency center point 21 is less than the bandpass function centerpoint as indicated by the filter bandpass function 60 having centerpoint 62 as shown superimposed in the figures; a second instance (FIG. 3(b)) where the laser frequency center point 21 is aligned with the bandpass function centerpoint 62; and, a third instance (FIG. 3(c)) where the laser frequency center point 21 is greater than the bandpass function centerpoint 62. In each instance, as depicted in corresponding FIGS. 4(a)–4(c), the laser diode drive voltage signal 15 is shown dithered (a sinusoid) resulting in the laser wavelength dithering in the same manner. The dithered laser diode spectra passes through the filter, and is converted to electrical form by the PIN diode 30. In each instance of the laser signals depicted in FIGS. 3(a) and 3(c) having frequency centerpoints respectively less than and greater than the band pass filter centerpoint, it is the case that the dither harmonic spectra does not pass through the frequency peak or centerpoint of the bandpass filter. Consequently, the resulting output of the PIN diode is an electric sinusoidal signal of the same frequency as the dither frequency such as depicted in corresponding FIGS. 5(a) and 5(c). It is noted that for the laser signals at frequencies below the peak (FIG. 3(a)) the feedback error signal 32 corresponds in frequency and phase to the dither signal (FIG. 5(a)), however for the laser signals at frequencies above the peak (FIG. 3(c)) the feedback error signal 32 corresponds in frequency but is 180° opposite phase of the dither signal (FIG. 5(c)). Due to the bipolar nature of the feedback signal (error signal) for cases when the laser signal centerpoint is misaligned with the bandpass filter centerpoint, it is thus known in what direction to drive the laser diode (magnitude and direction), which phenomena may be exploited in many different applications. For the laser signal depicted in FIG. 3(b) having the laser frequency center point aligned with the bandpass function centerpoint, the dither harmonic spectra is aligned with and passes through the frequency peak (maximum) of the bandpass filter twice. That is, during one cycle (a complete round trip of the sinusoid dither signal), the dither signal passes though the centerpoint twice. This results in a frequency doubling of the dither frequency of the feedback signal 32, i.e., a unique frequency doubling signature, as depicted as PIN diode output 32' in FIG. 5(b) showing an feedback error signal at twice the frequency of the dither frequency.

Thus, in each instance, as depicted in corresponding FIG. 5(b), the resulting feedback signal exhibits frequency doubling if the laser center wavelength is aligned with the filter center wavelength; otherwise it generates a signal with the same dither frequency, which is either in phase (FIG. 5(a)) or out of phase (FIG. 5(c)) with the original dither modulation. It should be understood that, for the case where there the laser center frequency is misaligned with the bandpass filter peak and yet there is exhibited partial overlap of the dither spectra through the bandpass filter peak (i.e., the centerpoint peak is traversed twice in a dither cycle), the PIN diode will detect partial frequency doubling laser at opposite phases depending upon whether the laser center frequency is inboard or outboard of the filter center frequency. Thus, even though partial frequency doubling is detected, it may still be detected from the feedback signal in which direction and magnitude the laser signal should be driven for alignment.

Referring now to FIGS. 6(a) and 6(c), for the case when the laser and filter are not aligned, the cross product signal 42 resulting from the mixing of the amplified feedback error with the original dither sinusoid is a signed error signal either at a first polarity (for the laser signals at frequencies below the bandpass filter centerpoint), such as shown in FIG. 6(a) or, at a second polarity (for the laser signals at frequencies above the bandpass filter centerpoint), such as shown in FIG. 6(c). Each of these signals may be rectified and converted into a digital output laser bias voltage signal 48 as shown in respective FIGS. 7(a) and 7(c), which are fed back to respectively increase or decrease the laser current (wavelength) in such a way that the laser center wavelength moves closer to the bandpass filter centerpoint. For the case when the laser and filter are aligned, the cross product generated is the frequency doubled signal (twice the frequency of the dither) as shown in the figures. Consequently, this results in a 0 V dc bias voltage (FIG. 7(b)) which will maintain the laser frequency centerpoint at its current wavelength value.

Figure 8A:
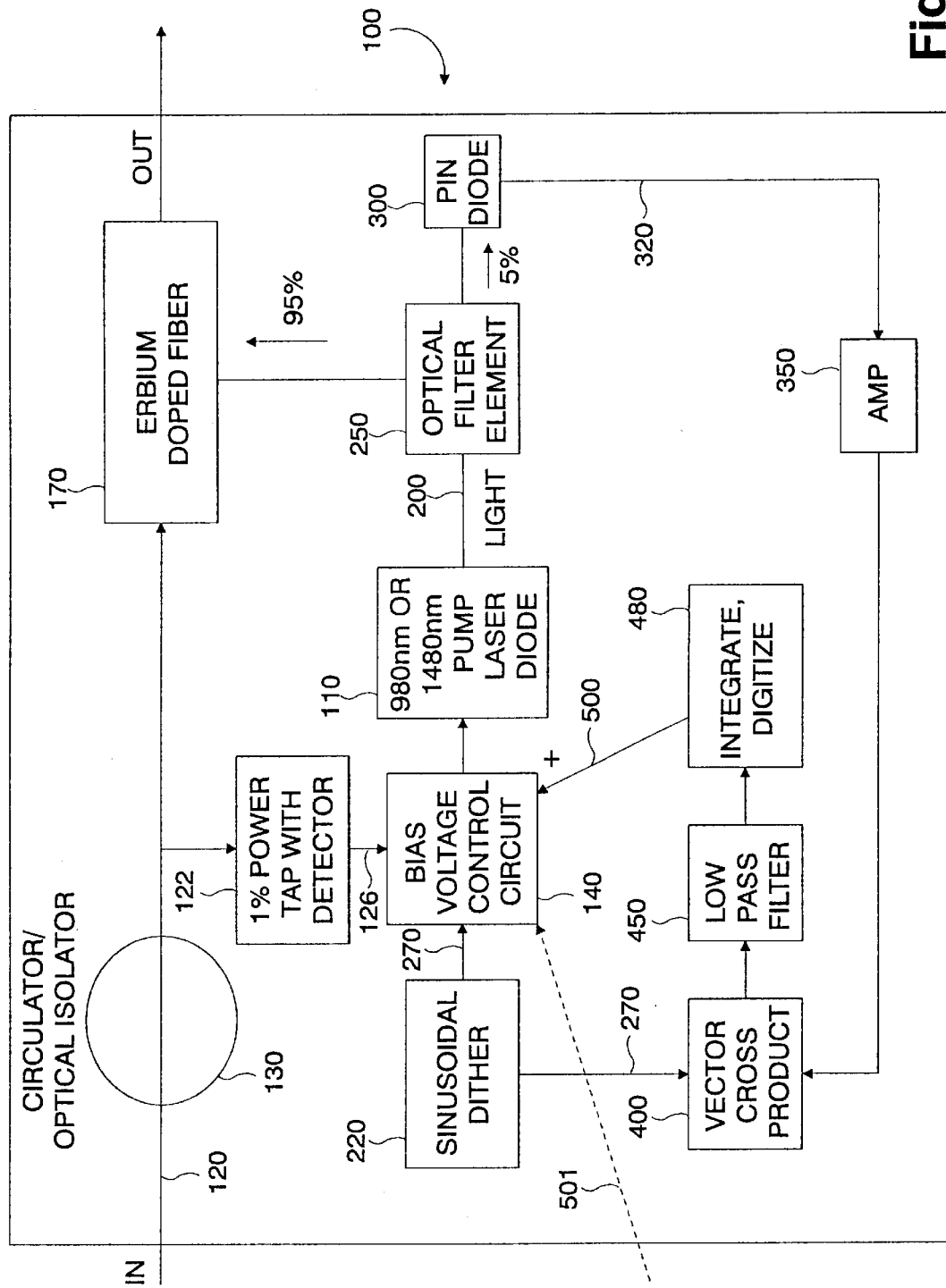
FIGS. 8(a)–8(c) illustrate various EDFA amplifier designs employing the WLL principle for providing automatic gain control according to the invention.
Figure 8B:
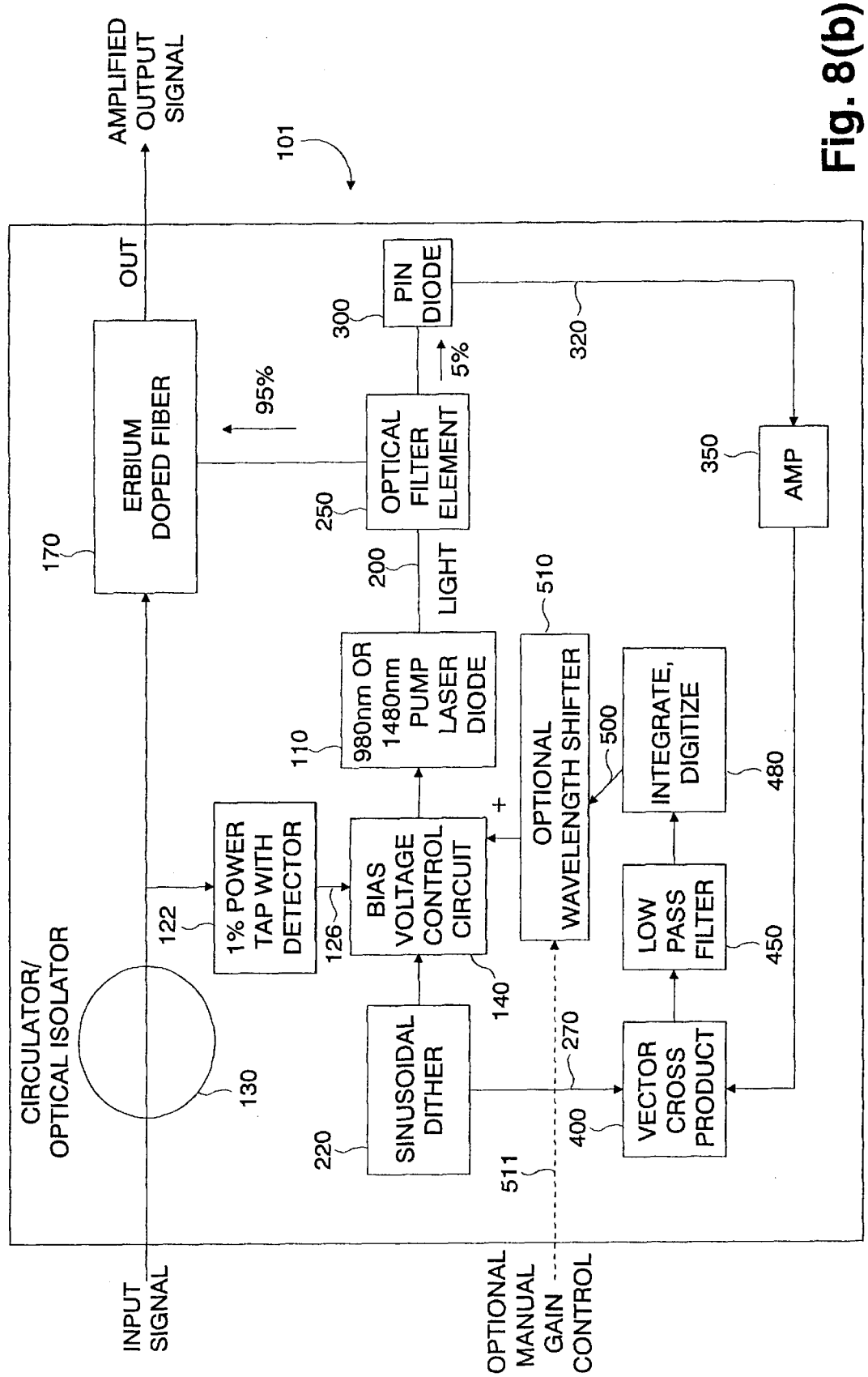
Figure 8C:
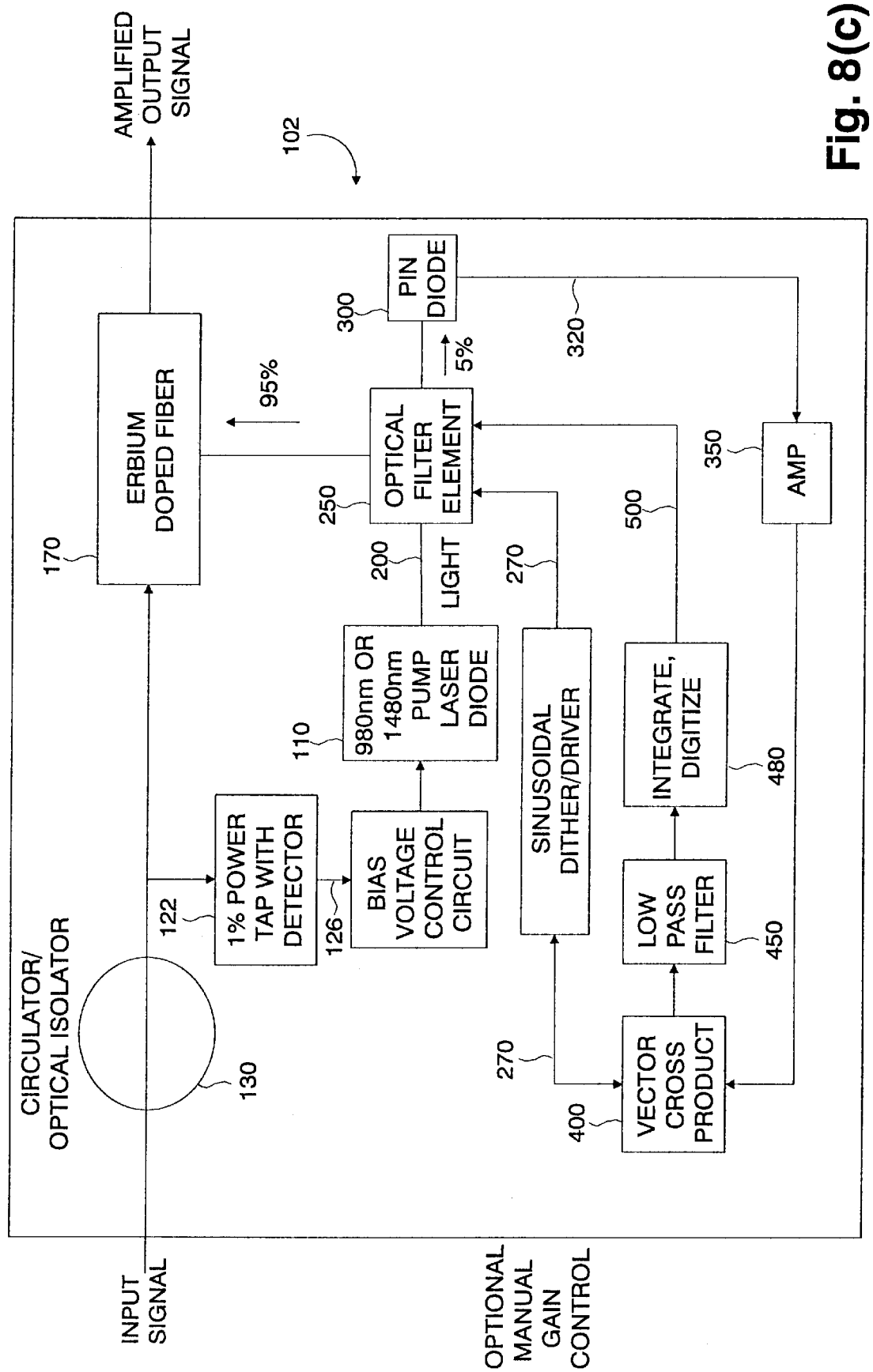

The concept of automatic gain control (AGC) for an optical amplifier 100 according to the present invention is now described with respect to FIGS. 8(a)–8(c). As shown in FIG. 8(a), a small amount of the input optical signal, for example, 1%, is tapped off using an optical splitter 122. It should be understood that although the invention does not require a large amount of light to operate; more light may be tapped off by the splitter as the total signal will be amplified anyway. The light that is tapped off passes to a photodetector where it is converted into an electrical signal 126 that is proportional to the total optical power of the input signal provided to the input fiber. Changes to the input power, such as may be caused by the addition or dropping of a channel, would be detectable by this interface. Optionally, optical filters may be combined at this interface to monitor power levels on specific channels only. That is, optical filters may be located after the light is tapped off by optical splitter 122 to enable monitoring of optical power for selected wavelengths as desired, rather than monitoring the average optical power of all wavelengths. When the photodetector determines that there has been an increase or decrease in the amplifier input power level, the resulting electrical signal 126 is passed to a digital control circuit which regulates the bias current of the amplifier's pump laser diode 140. The amplitude of this signal 126 is used by the pump laser diode driver circuit to determine the amount by which the diode output power should be increased or decreased. However, rather than directly changing the laser optical output according to the change in the bias current, according to the invention, the amount of optical power delivered to the EDFA is controlled by dynamically aligning the center wavelength of the pump laser 110 and the peaked center wavelength of a bandpass optical filter element 250 which is commonly used in optical amplifiers anyway. This control is affected by the WLL, integrated within the EDFA amplifier design 100. Thus, as shown in FIG. 8(a), the pump laser 110 is modulated by a low data rate dither signal 270 (e.g. in the kHz range or less) generated by the sinusoidal dither generator (harmonic oscillator) 220 without affecting normal operation of the pump laser. The dithered pump laser signal 200 passes through an optical filter element, e.g., bandpass filter 250, which is designed to tap off a small amount of light 290, for example, which is incident upon a photo detector receiver device, e.g., P-I-N diode 300, and converted into an electrical feedback signal 320. The amount of light that may be tapped off may range anywhere between one percent (1%) to five percent (5%) of the optical output signal, however, skilled artisans will appreciate any amount of laser light above the noise level that retains the integrity of the output signal including the dither modulation characteristic, may be tapped off (i.e., less than 1%). The remaining laser light passes on through the filter 250 for input to the Erbium doped optical fiber 170.

The optical filter 250 is tuned to the appropriate wavelength of the pump laser, typically either 980 nm or 1450 nm center wavelength. However, because of unavoidable misalignment between the laser center wavelength and the filter center wavelength, the light emerging from the laser-filter combination will be modulated in intensity. The PIN photodiode signal 320 is amplified by amplifier device 350 and fed back to the mixer circuitry 400 for generating the vector cross product between the PIN diode output 320 and the original dither signal 270. By integrating and digitizing this result, a feedback control signal 500 is obtained which determines whether the laser and filter center wavelengths are aligned, and if not, by what amount and in what direction the laser wavelength must be adjusted to bring them into alignment. This feedback control signal 500 is input back to the laser bias control circuit 140 to adjust the wavelength of the pump laser diode output signal accordingly. It is thus demonstrated that the tapped off amplifier input signal and 126 and the feedback control signal 500 provide the necessary information to implement AGC in the EDFA amplifier 100 according to the invention.

Figure 10:
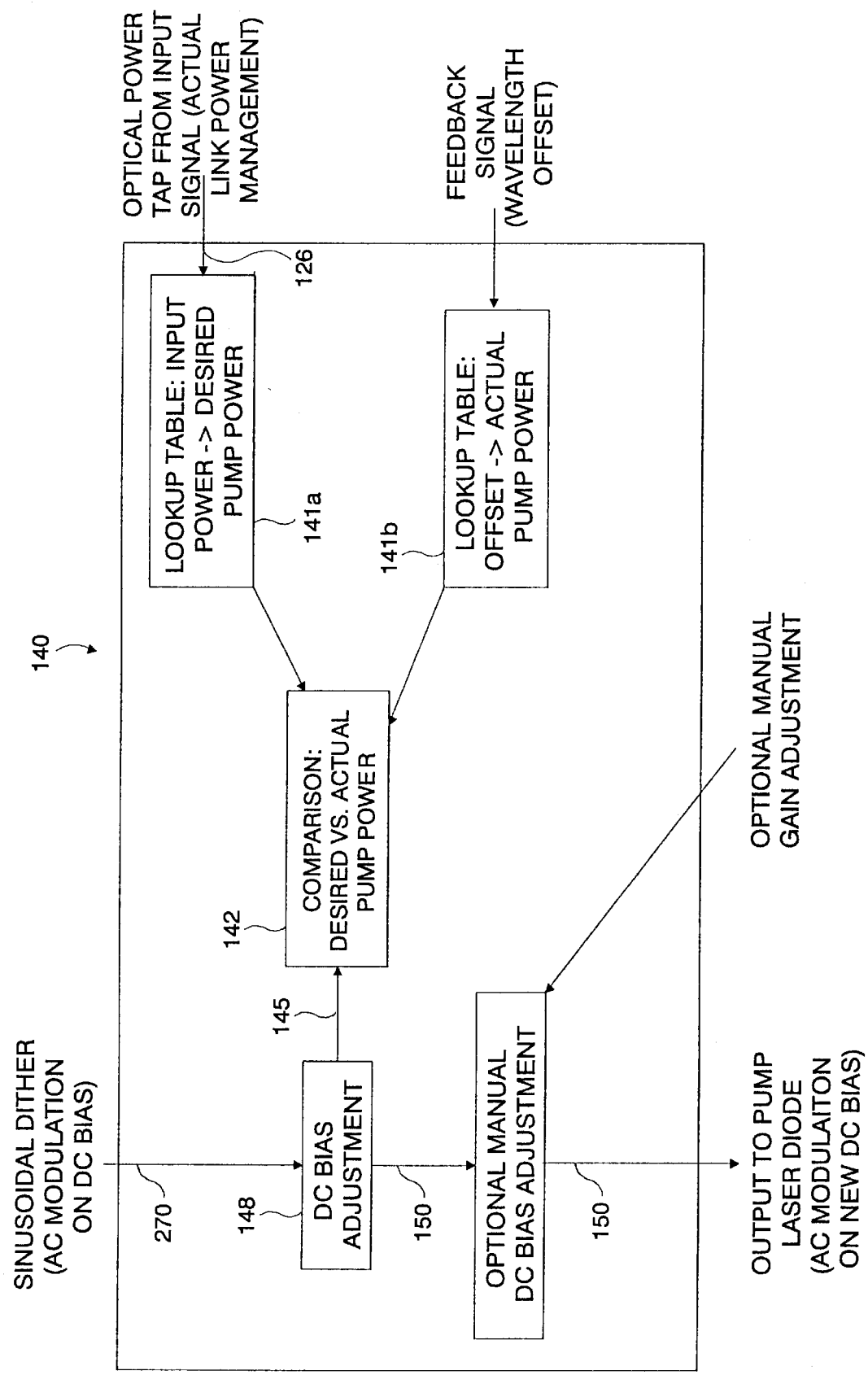
FIG. 10 is a detailed block diagram illustrating the components of the bias voltage control circuit 140

FIG. 10 is a detailed block diagram illustrating the components of the bias voltage control circuit 140 of FIG. 8(a). As shown in FIG. 10, the tapped input signal 126 provides the information about how much optical power is going into the amplifier, while the feedback error signal 500 informs what the pump laser power is (by providing the wavelength offset between the pump laser and its optical filter). The bias control circuit includes a lookup table 141a which maps a given input power to a desired pump power (desired gain), and a lookup table 141b which maps the wavelength offset measure to the actual pump power provided (actual gain). A comparator device 142 determines the difference between the desired pump power and the actual pump power and generates control signal 145 for adjusting the bias signal 150 output of the dc bias signal generator 148 according to the desired given amount of gain until it matches the desired value. The adjusted dc bias signal 150 from the generator 148 (which includes the ac dither modulation 270) is input to the pump laser diode. As further shown in FIG. 10, is the provision of an optional receiver device 149 for receiving a remote generated manual gain adjustment signal 501 for enabling manual AGC override.

Preferably, when the EDFA input remains constant, the EDFA gain is also held constant by keeping the pump laser center wavelength aligned with the optical filter. The amount of gain in this condition may be preset by the design of the feedback circuit to any desired level within the amplifier's dynamic range. That is, the design of the feedback circuit may influence the amount of system gain achieved in the stable state by varying parameters in the feedback loop design such as: the center wavelength and rolloff of the bandpass filter, the electrical amplification in the feedback loop, or the wavelength vs. drive current characteristics of the pump laser diode. In operation, when the EDFA input power changes by adding or dropping a wavelength channel, the gain is adjusted accordingly. For example, by moving the laser center wavelength further away from optimal alignment with the filter, the pump power delivered to the EDFA (and the EDFA gain) is decreased. By moving the laser center wavelength into better alignment with the filter, the EDFA gain is increased. The control circuit 140 may effect an increase or decrease of the EDFA gain by the proper amount to account for adding or dropping of multiple channels on the EDFA input. It should be understood that if the pump laser output power changes in any way while its wavelength is being adjusted, the feedback loop accounts for this by adjusting the response of the laser-filter system accordingly. In this way, the invention enables the use of less exact pump lasers with lower tolerances and hence lower cost.

Although the WLL will automatically maintain tracking of the laser center wavelength to the peak of the optical filter, it may not always be desirable to enable laser alignment with the filter peak. Thus, as further depicted in FIG. 8(a), the EDFA optical amplifier 100 implementing the WLL principle for AGC according to the invention, may be provisioned with an optional AGC override. That is, as shown in FIG. 8(a), an input 501 to the control circuit 140 may be provided that enables manual override of the AGC and adjustment of the EDFA gain as desired from a remote location. This manual adjustment may be desirable during optical network maintenance when, for example, conditions may require higher gain without changing the number of input channels. In a modified optical amplifier 101 employing AGC control by utilizing the WLL principle as shown in FIG. 8(b), there is provided an optional external tuning circuit, referred to as a wavelength shifter device 510, that receives the error signal 500 and varies or offsets it so that the laser center wavelength may be shifted or offset for gain control purposes. That is, the wavelength shifter 510 may allow some external input 511, e.g., a manual control element such as a knob, to introduce an arbitrary, fixed offset between the laser center wavelength and the filter peak. In a modified optical amplifier 102 employing AGC control as shown in FIG. 8(c), the WLL servo-control system of FIG. 2(c) may be implemented for tuning a tunable frequency selective device. That is, the WLL servo-control system may be implemented for tuning the optical filter element 250 that feeds the pump signal to the erbium doped fiber 170 according to the desired gain level. Thus, as shown in FIG. 8(c), a bias voltage device 140 applies a bias signal to the laser diode 120 for generating an optical signal 200 having a peaked spectrum function. This light signal is input to a tunable frequency selective device 250, e.g., a tunable bandpass filter. As shown in FIG. 8(c), however, a sinusoidal dither/driver device 220 is implemented for modulating the peak center frequency of filter pass band with a small dither signal 270. A small amount of light 290 is tapped off the output of the filter 250 for input to the photodetector device, e.g., PIN diode 300, where the optic signal is converted to electrical signal 320, amplified by amplifier device 350, and input to the mixer device 400 which additionally receives the dither signal 270. The mixer device generates the vector cross product 420 of the amplified feedback signal 370 with the dither signal 270 and that result is low-pass filtered, and smoothed (e.g., integrated) by integrator device 480 to provide error signal 500, in the manner discussed herein. This error signal 500 may be a bi-polar signal and may be used to dynamically adjust the peak center frequency of the filter passband until it matches the center frequency of the laser signal input 200 for effecting maximum power gain at the desired frequency.

In another embodiment of the present invention, the EDFA optical amplifier 100 implements the WLL principle for minimizing the affects of ASE in the amplifier without providing amplifier AGC. As described herein, ASE results from either spontaneous emission of photons in the erbium doped fiber, which are later captured in the output fiber and amplified, or from the effect of pumping the EDFA at a broad range of wavelengths besides the nominal pump center wavelength. This latter effect may be minimized by filtering the pump laser input to the EDFA and is one reason why commercial EDFAs commonly include an optical filter between the pump laser and EDFA. However, this also introduces significant optical loss into the system, because of the unavoidable misalignment between the pump diode center wavelength and the center wavelength of the bandpass filter.

Figure 9A:
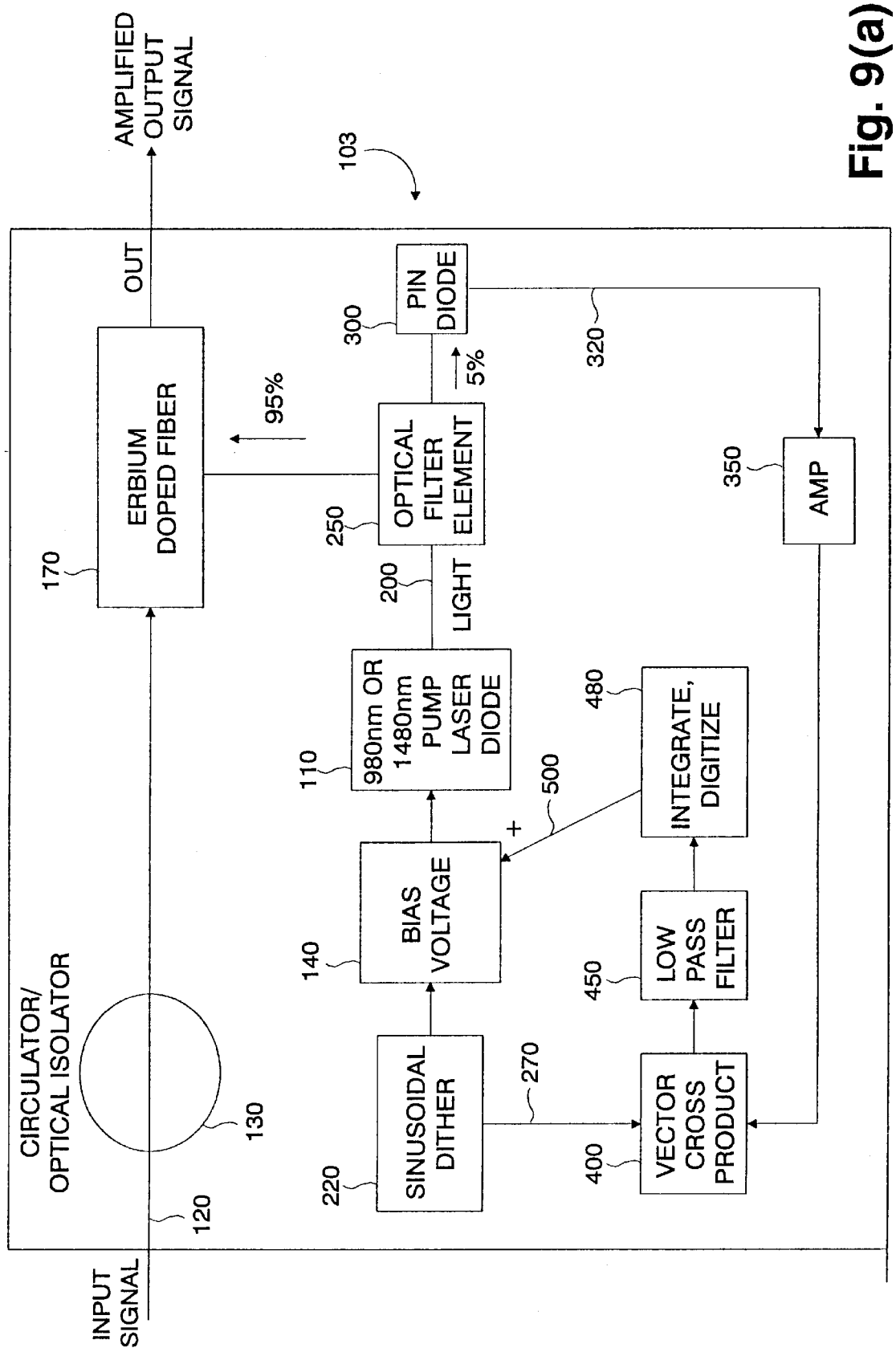
FIGS. 9(a)–9(b) illustrate various EDFA amplifier designs employing the WLL principle for eliminating ASE noise according to the invention.
Figure 9B:
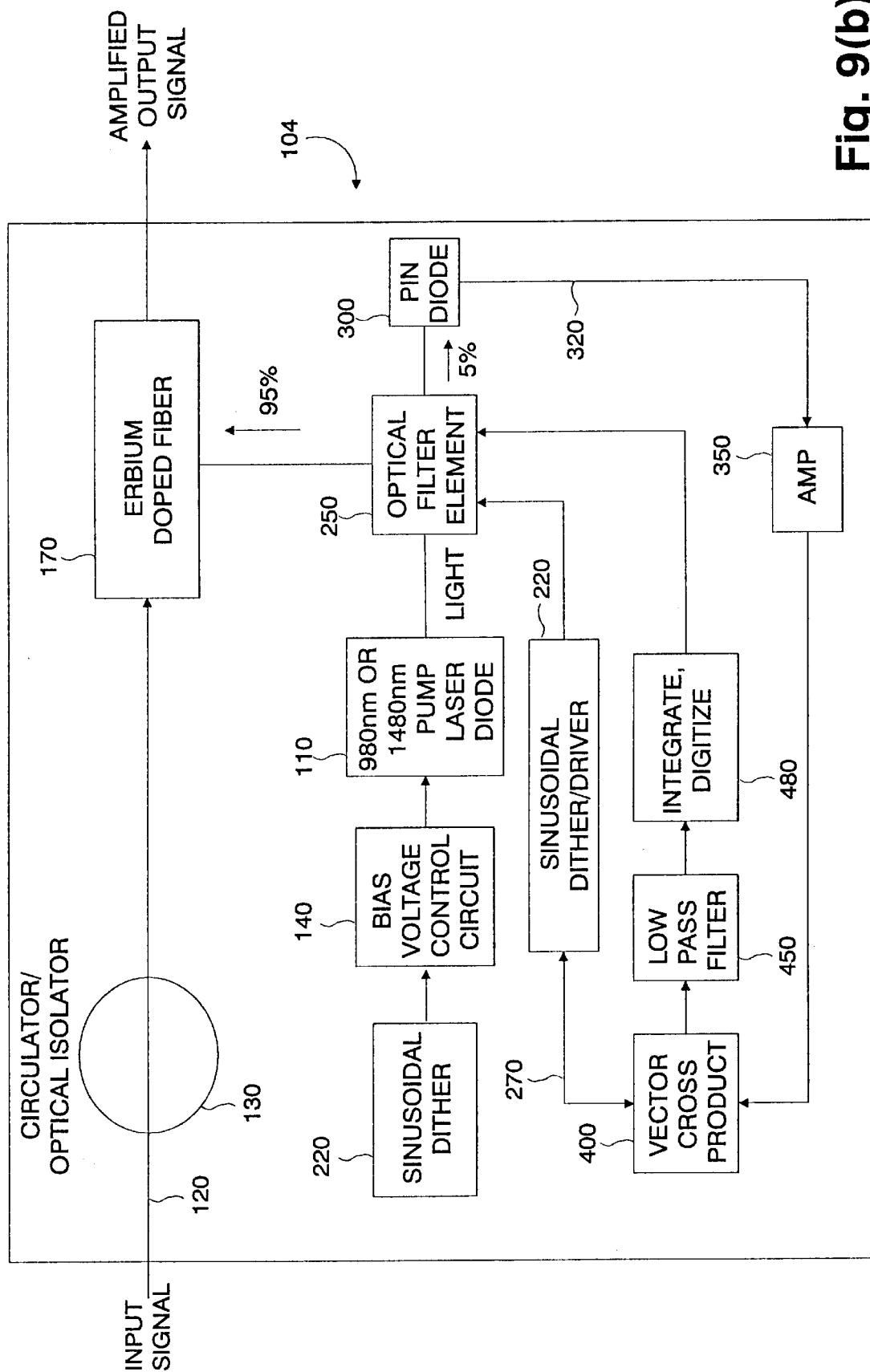

Thus, according to a further aspect of the invention, as depicted in FIG. 9(a), the WLL principle is implemented to simply maintain optimal alignment between the pump laser and filter at all times and thereby minimize ASE without AGC. FIG. 9(a) particularly depicts an optical amplifier 103 modified with the WLL servo-control loop for removing unwanted noise in the optical output of the amplifier. As shown in FIG. 9(a), the pump laser 110, operating typically at either 980 nm or 1480 nm center wavelength, is modulated by a low data rate (kHz or less) dither signal 270 which does not affect normal operation of the pump laser. After the dithered light passes through an optical filter element, a small fraction (5%) of the pump laser output is split off and passes to a photodetector 300, where it is converted into an electrical signal 320. At this point, the optical filter may not be tuned to the appropriate wavelength of the pump laser, e.g., typically either 980 nm or 1480 nm center wavelength. However, because of unavoidable misalignment between the laser center wavelength and the filter center wavelength, the light emerging from the laser-filter combination will be modulated in intensity. The PIN photodiode signal 320 is amplified by amplifier 350 and fed back to a control loop 400, which implements the vector cross product between the PIN diode output and the original dither signal 270; by integrating and digitizing this result (by elements 450 and 480), it is possible to obtain an error signal 500 which determines whether the laser and filter center wavelengths are aligned., and if not by what amount and in what direction the laser wavelength must be adjusted to bring them into alignment. This feedback control signal 500 is thus input to the laser bias control circuit 140 which accordingly adjusts the laser signal center wavelength to align with the peaked bandpass filter according to the WLL principle to thereby minimize existence of extraneous noise components being input to and amplified by the optical amplifier. FIG. 9(b) particularly depicts an alternative embodiment for the optical amplifier 104, that is modified with the WLL servo-control loop according to FIG. 2(c), for tuning the frequency selective element, i.e., bandpass filter 250, so that it may align with the center wavelength of the laser optical signal at the desired wavelength. That is, a bi-polar error signal 500 may be generated and used to dynamically adjust the peaked center frequency of the filter passband until it aligns with the center frequency of the laser signal input 200 according to the WLL principle to thereby minimize existence of extraneous noise components being input to and amplified by the optical amplifier.

Note that the servo-control circuitry implementing the WLL principle in each of the embodiments compensates for not only manufacturing tolerances in the pump laser and filter wavelength characteristics (enabling the use of lower cost lasers and filters) but also compensates over time for any changes in the wavelength properties of the laser, filter, or both (for example, due to temperature changes, power supply variations on the pump diode, laser aging effects, mechanical shock and vibration of the laser/filter system, etc.) The embodiment illustrated in FIGS. 9(a)–9(b), thus offers many advantages. When employed for AGC in the embodiments as illustrated in FIGS. 8(a)–8(c), the ASE is also reduced at the same time, however, the AGC adjustments of the laser-filter combination may not make it possible to minimize ASE under all conditions.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims. For instance, the principles described herein may be applied to fiber optic amplifiers doped with other rare earth element ions.

Having thus described our invention, what we claim as new, and desire to secure by Letters Patent is:

1. In an optically pumped amplifier including an optical isolator device for receiving an input optical signal, a laser pump device for generating a laser pump signal having a peaked spectrum function including a center wavelength, an optical filter having a peaked passband function including a center wavelength implemented for receiving said laser pump signal and passing said laser pump signal at a pre-determined wavelength for amplifying said input signal, and, a doped fiber element for receiving said input signal and said laser pump signal and amplifying said input light signal in response to receipt of a laser pump signal at said pre-determined wavelength, an automatic gain control circuit comprising:

a bias voltage device for generating a bias signal for input to said laser pump diode, a center frequency of said laser pump signal being determined by a magnitude of said bias signal;

a device for tapping off a portion of said input signal to said optically pumped amplifier;

a control circuit for receiving said tapped off input signal portion and generating a control signal for regulating an amount of bias signal applied to said pump laser diode; and, wavelength-locked loop circuit for regulating the amount of optical power delivered to said doped fiber element by enabling real time adjustment of said laser pump signal center wavelength with respect to said optical filter peaked passband center wavelength in accordance with said control signal, wherein automatic gain control is provided according to changing conditions of said input signal.

2. The automatic gain control circuit as claimed in claim 1, wherein said wavelength-locked loop servo-control circuit comprises:

mechanism for applying a dither modulation signal at a dither modulation frequency to said laser pump signal, and inputting said dither modulated laser pump signal to said optical filter;

mechanism for converting a portion of said dither modulated laser pump signal to an electric feedback signal;

mechanism for continuously comparing said feedback signal with said dither modulation signal and generating an error signal representing a difference between a frequency characteristic of said feedback signal and a dither modulation frequency; and mechanism for automatically adjusting the center wavelength of said peaked spectrum function of said laser pump signal according to said error signal, whereby a maximum gain level is achieved when said frequency characteristic of said feedback signal is two times said dither modulation frequency, therein resulting in alignment of said center wavelength of said laser pump signal and said peaked passband function of optical filter.

3. The automatic gain control circuit as claimed in claim 1, wherein said input signal comprises a plurality of wavelength channels, a condition of said input signal changes due to elimination or addition of one or more wavelength channels, said wavelength-locked loop circuit respectively regulating the amount of optical power delivered to said doped fiber element by one of: providing real time offset adjustment of said laser pump signal center wavelength with respect to said optical filter peaked passband center wavelength for decreasing gain of said optical amplifier, and, enabling real time alignment of said laser pump signal center wavelength with said optical filter peaked passband center wavelength for increasing gain of said optical amplifier.

4. The automatic gain control circuit as claimed in claim 1, wherein said device for tapping off a portion of said input signal is an optical splitter.

5. The automatic gain control circuit as claimed in claim 1, wherein said optical fiber element is doped with Erbium ions.

6. The automatic gain control circuit as claimed in claim 2, comprising wherein said control circuit includes one or more optical filter devices for monitoring power levels on specific wavelength channels of said input signal, and regulating the amount of optical power delivered to said doped fiber element according to power level changes on said specific wavelength channels.

7. The automatic gain control circuit as claimed in claim 2, wherein said mechanism for applying a dither modulation to said bias signal is a sinusoidal dither circuit for generating a sinusoidal dither modulation signal of a predetermined frequency.

8. The automatic gain control circuit as claimed in claim 2, wherein said converting mechanism is a photodetector device.

9. The automatic gain control circuit as claimed in claim 2, wherein said mechanism for comparing includes a mixer capable of combining said converted feedback signal with said sinusoidal dither modulation signal and generating a cross-product signal having components representing a sum and difference at dither frequencies.

10. The automatic gain control circuit as claimed in claim 2, further including mechanism enabling manual adjustment of said control signal for regulating an amount of bias signal applied to said pump laser diode.

11. The automatic gain control circuit as claimed in claim 1, wherein said optical fiber element is doped with ions selected from the group comprising rare-earth elements.

12. The automatic gain control circuit as claimed in claim 9, wherein said mechanism for automatically adjusting the center wavelength of said peaked spectrum function of said laser pump signal according to said error signal, further includes:

low-pass filter device for filtering said output cross-product signal; and integrator circuit for averaging said output cross-product signal to generate said error signal, whereby said error signal is positive or negative depending on whether a center wavelength of said laser pump signal is respectively less than or greater than said desired wavelength of said optical filter.

13. The automatic gain control circuit as claimed in claim 10, wherein said manual adjustment mechanism may be remotely operated.

14. A method for providing automatic gain control in an optical amplifier including an optical isolator device for receiving an input optical signal, a laser pump device for generating a laser pump signal having a peaked spectrum function including a center wavelength, an optical filter having a peaked passband function including a center wavelength implemented for receiving said laser pump signal and passing said laser pump signal at a predetermined wavelength for amplifying said input signal, and, a doped fiber element for receiving said input signal and said laser pump signal and amplifying said input light signal in response to receipt of a laser pump signal at said pre-determined wavelength, said automatic gain control method comprising the steps of:

a) generating a bias signal for input to said laser pump diode, a center frequency of said laser pump signal being determined by a magnitude of said bias signal;

b) tapping off a portion of said input signal to said optically pumped amplifier;

c) receiving said tapped off input signal portion and generating a control signal for regulating an amount of bias signal applied to said pump laser diode; and, d) regulating the amount of optical power delivered to said doped fiber element by enabling real time adjustment of said laser pump signal center wavelength with respect to said optical filter peaked passband center wavelength in accordance with said control signal, wherein automatic gain control is provided according to changing conditions of said input signal.

15. The method for providing automatic gain control in an optical amplifier as claimed in claim 14, wherein said regulating step d) comprises the steps of:

applying a dither modulation signal at a dither modulation frequency to said laser pump signal, and inputting said dither modulated laser pump signal to said optical filter;

converting a portion of said dither modulated laser pump signal to an electric feedback signal;

continuously comparing said feedback signal with said dither modulation signal and generating an error signal representing a difference between a frequency characteristic of said feedback signal and a dither modulation frequency; and automatically adjusting the center wavelength of said peaked spectrum function of said laser pump signal according to said error signal, whereby a maximum gain level is achieved when said frequency characteristic of said feedback signal is two times said dither modulation frequency, therein resulting in alignment of said center wavelength of said laser pump signal and said peaked passband function of optical filter.

16. The method for providing automatic gain control in an optical amplifier as claimed in claim 14, wherein said input signal comprises a plurality of wavelength channels, a condition of said input signal changes due to elimination or addition of one or more wavelength channels, said step d) of regulating the amount of optical power delivered to said doped fiber including: providing real time offset adjustment of said laser pump signal center wavelength with respect to said optical filter peaked passband center wavelength for decreasing gain of said optical amplifier; and, enabling real time alignment of said laser pump signal center wavelength with said optical filter peaked passband center wavelength for increasing gain of said optical amplifier.

17. The method for providing automatic gain control in an optical amplifier as claimed in claim 14, wherein said optical amplifier includes one or more optical filter devices for monitoring power levels on specific wavelength channels of said input signal, said regulating step further including the step of: and regulating the amount of optical power delivered to said doped fiber element according to power level changes on a specific wavelength channels.

18. The method for providing automatic gain control in an optical amplifier as claimed in claim 14, wherein said optical filter is a tunable wavelength selective device, said regulating step d) comprising the steps of:

a) applying a dither modulation signal at a dither modulation frequency to said tunable wavelength selective device, said tunable wavelength selective device further receiving said laser pump signal having a center wavelength and generating a dither modulated electromagnetic signal for output thereof;

b) converting a portion of said dither modulated electromagnetic signal to an electric feedback signal;

c) continuously comparing said feedback signal with said dither modulation signal and generating an error signal representing a difference between a frequency characteristic of said feedback signal and a dither modulation frequency; arid d) adjusting a passband center wavelength of said tunable wavelength selective device according to said error signal, wherein said center wavelength of said electromagnetic signal and said tunable wavelength selective device center wavelength become aligned when said frequency characteristic of said feedback signal is two times said dither modulation frequency.

19. The method for providing automatic gain control in an optical amplifier as claimed in claim 15, wherein said continuously comparing step c) includes the steps of:

combining said converted feedback signal with said dither modulation signal and generating a cross-product signal having components representing a sum and difference at dither frequencies;

filtering said output cross-product signal; and averaging said output cross-product signal to generate said error signal, said error signal being positive or negative depending on whether a center wavelength of said optical signal is respectively less than or greater than said desired wavelength of said wavelength selective device.

20. The automatic gain control circuit as claimed in claim 1, wherein said optical filter is a tunable wavelength selective device, said wavelength-locked loop servo-control circuit comprising:

mechanism for applying a dither modulation signal at a dither modulation frequency to said tunable wavelength selective device, said tunable wavelength selective device further receiving said optical signal having a center wavelength and generating a dither modulated optical signal for output thereof;

mechanism for converting a portion of said dither modulated optical signal to an electric feedback signal;

mechanism for continuously comparing said feedback signal with said dither modulation signal and generating an error signal representing a difference between a frequency characteristic of said feedback signal and a dither modulation frequency; and mechanism for adjusting a passband center wavelength of said tunable wavelength selective device according to said error signal until a predetermined relation exists between a frequency characteristic of said converted feedback signal and said dither modulation frequency, whereby when said predetermined relation exists, said desired wavelength of said wavelength selective device exactly matches a wavelength of said input optical signal.

21. The automatic gain control circuit as claimed in claim 20, wherein said predetermined relation exists when a frequency of said feedback signal is two times a dither modulation frequency.

* * * * *